(12) United States Patent
Nebendahl (10) Patent No.: US 11,522,340 B2
(45) Date of Patent: Dec. 6, 2022

(54) LASER WAVELENGTH CENTER LOCK USING PHOTONIC INTEGRATED CIRCUIT

(71) Applicant: Keysight Technologies, Inc., Santa Rosa, CA (US)

(72) Inventor: Bernd Nebendahl, Ditzingen (DE)

(73) Assignee: Keysight Technologies, Inc., Santa Rosa, CA (US)

( * ) Notice: Subject to any disclaimer, the term of this patent is extended or adjusted under 35 U.S.C. 154(b) by 165 days.

(21) Appl. No.: 17/037,439

(22) Filed: Sep. 29, 2020

(65) Prior Publication Data

US 2021/0126427 A1  Apr. 29, 2021

Related U.S. Application Data

(60) Provisional application No. 62/926,790, filed on Oct. 28, 2019.

(51) Int. Cl.
*H04B 10/04* (2006.01)
*H01S 5/0683* (2006.01)
(Continued)

(52) U.S. Cl.
CPC .......... *H01S 5/0683* (2013.01); *H01S 3/1062* (2013.01); *H04B 10/503* (2013.01); *H04B 10/572* (2013.01); *H04B 10/66* (2013.01)

(58) Field of Classification Search
CPC .... H04B 10/503; H04B 10/572; H04B 10/40; H04B 10/2507; H04B 10/5057;
(Continued)

(56) References Cited

U.S. PATENT DOCUMENTS 6,671,296 B2 * 12/2003 May .................. H01S 5/0014
372/98
7,471,710 B2  12/2008 Cliche et al.
(Continued)

FOREIGN PATENT DOCUMENTS

RU  2480876 C2  4/2013

OTHER PUBLICATIONS

English translation of RU2480876, 11 pgs., 2011.
(Continued)

*Primary Examiner* — Hanh Phan (57) ABSTRACT

An apparatus includes an optical splitter configured to receive an optical signal and to split the input optical signal to provide a first and a second optical signal. The apparatus further includes an interferometer comprising a first arm and a second arm, with the first arm being configured to receive the first optical signal, and the second arm being configured to receive the second optical signal. Notably a portion of the first arm is exposed to a reference gas that attenuates light of a characteristic wavelength. The apparatus further includes an optical coupler configured to receive an output optical signal from the first arm, and an output optical signal from the second arm and to provide a third optical signal; and a photodetector configured to receive the third optical signal, and to provide a photocurrent. The photocurrent increases when the difference between the characteristic wavelength and the wavelength of the optical signals increases. The apparatus also comprises a feedback control circuit configured to change the properties of the laser to be locked until an error signal indicative of the difference between the characteristic wavelength and the wavelength of the laser is substantially zero.

20 Claims, 5 Drawing Sheets

(51) Int. Cl.
　　　*H04B 10/50*　　　(2013.01)
　　　*H01S 3/106*　　　(2006.01)
　　　*H04B 10/572*　　(2013.01)
　　　*H04B 10/66*　　　(2013.01)

(58) Field of Classification Search
　　　CPC ..... H04B 10/66; G01S 5/0683; G01S 5/0687;
　　　　　　　　　　　　　　　　　　　　　　　　G01S 3/1062
　　　USPC ....... 398/182, 183, 186, 187, 192, 193, 194,
　　　　　　　　　398/195, 196, 197, 198, 135, 136, 137,
　　　　　　　　　　　　398/33, 38, 158, 159, 202, 208, 209;
　　　　　　　　　372/20, 32, 34, 36, 38.02, 29.02, 29.011
　　　See application file for complete search history.

(56)　　　　　　　　　References Cited

U.S. PATENT DOCUMENTS

| 8,050,301 B2* | 11/2011 | Wells ................... H01S 3/1392 |
| | | 372/20 |
| 10,263,390 B2 | 4/2019 | Parker et al. |
| 10,411,436 B2 | 9/2019 | Brueck et al. |
| 2019/0199060 A1* | 6/2019 | Parker ................ G02B 6/29353 |
| 2019/0260177 A1 | 8/2019 | Petros et al. |

OTHER PUBLICATIONS

Fupeng Wang et al., "Distributed gas detection utilizing Fourier domain optical coherence based absorption spectroscopy", Elsevier B.V., Results in Physics 13 (2019) 102104, pp. 1-6.

* cited by examiner

LASER WAVELENGTH CENTER LOCK USING PHOTONIC INTEGRATED CIRCUIT

CROSS-REFERENCE TO RELATED APPLICATIONS

This present application is claims priority under 35 U.S.C. § 119(e) from U.S. Provisional Application 62/926,790 filed on Oct. 28, 2019, which names Bernd Nebendahl as inventor. The entire disclosure of U.S. Provisional Application 62/926,790 is specifically incorporated herein by reference.

BACKGROUND

Wavelength stabilized lasers are used in a variety of applications. For example, such lasers may be used as a reference laser for interferometers that are either used for length measurement or for wavelength measurement using a scanning Michelson Interferometer. Without such stabilization, the wavelength of the signal output from the laser may drift during operation. This alteration, or drift, can be caused by one of a number of factors, such as changes in temperature of the laser during operation. Regardless of the source of the drift, in order to maintain accuracy of the laser, continuous monitoring and adjustment of the laser is needed to maintain the output of the laser to a desired wavelength and tolerance.

Often, Helium-Neon (He—Ne) gas lasers are used as the wavelength stabilized laser. However, He—Ne lasers are comparatively expensive, and have a comparatively short lifetime, further adding to the cost of their use. Other wavelength reference lasers available include tunable semiconductor distributed feedback (DFB) lasers. Wavelength control of the output of such lasers often is based on a dither free locking scheme, which is referred to as a side-lock with high short-term stability. However, such lasers have a lower absolute stability.

Alternatively, wavelength control of the output of such lasers often is based on a center-lock scheme that requires a small dithering of the actual wavelength. Dithering renders these lasers impractical in certain applications since sidemodes are created by the dither combined with the finite velocity of the scan. As such, these lasers are impractical for use in a scanning Michelson Interferometer.

Other devices and methods to provide a wavelength stabilized laser include the Pound-Drever-Hall scheme. Such devices avoid the modulation of the laser, but require expensive high-speed modulators, detectors and electronics.

What is needed, therefore, is a center-lock wavelength stabilized semiconductor laser that is comparatively inexpensive and overcomes the shortcomings of known lasers such as discussed above.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only and is not intended to be limiting. The defined terms are in addition to the technical and scientific meanings of the defined terms as commonly understood and accepted in the technical field of the present teachings.

Unless otherwise noted, when a first element (e.g., an optical waveguide) is said to be connected to a second element (e.g., another optical waveguide), this encompasses cases where one or more intermediate elements or intervening devices may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a photonic IC) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

Various embodiments of an apparatus for locking a wavelength of a laser are disclosed below. In one representative embodiment, the apparatus comprises: an optical splitter configured to receive an optical signal and to split the input optical signal to provide a first and a second optical signal. The apparatus further comprises an interferometer comprising a first arm and a second arm, with the first arm being configured to receive the first optical signal, and the second arm being configured to receive the second optical signal. Notably a portion of the first arm is exposed to a reference gas that attenuates light of a characteristic wavelength.

The apparatus further comprises an optical coupler configured to receive an output optical signal from the first arm, and an output optical signal from the second arm and to provide a third optical signal; and a photodetector configured to receive the third optical signal, and to provide a photocurrent. The photocurrent increases when the difference between the characteristic wavelength and the wavelength of the optical signal increases. The apparatus also comprises a feedback control circuit configured to change the properties of the laser to be locked until an error signal indicative of the difference between the characteristic wavelength and the wavelength of the laser ('wavelength difference') is substantially zero. In one illustrative embodiment, by "substantially zero", the error signal is zero ±0.01. However, and as will be appreciated from the present teachings, the wavelength difference is desirably zero. That is, ideally, the error signal is zero if an only if the wavelength difference is zero. The scaling between error signal and wavelength difference depends on many factors. More generally, the error signal that can generate a wavelength difference of approximately 10 ppm is useful.

In another representative embodiment, a photonic integrated circuit (IC) for locking a wavelength of a laser is disclosed. The photonic IC comprises: a substrate; an optical splitter disposed over the substrate and configured to receive an optical signal and to split the input optical signal to provide a first and a second optical signal; and an interferometer disposed over the substrate and comprising a first arm and a second arm. Notably, the first arm is configured to receive the first optical signal and the second arm is configured to receive the second optical signal. Moreover, a cladding layer of the first arm has a thickness selected so a portion of the wave from the first arm is exposed to a reference gas that attenuates light of at least one characteristic wavelength. Notably, and as will become clearer as the present description continues, the portion of the wave from the first arm that exposed to the reference gas depends on the type of waveguide used. For example, in a slab waveguide, the portion of the wave from the first arm exposed to the reference gas is an evanescent wave. By contrast, in a slot waveguide a maximum of the Gaussian mode will be exposed to the reference gas, and not the part of the mode that is decaying perpendicular to the propagation direction. The photonic IC also comprises an optical coupler disposed over the substrate and configured to receive an output optical signal from the first arm, and an output optical signal from the second arm, and to provide a third optical signal. The photonic IC also may comprise a photodetector disposed over the substrate and configured to receive the third optical signal, and to provide a photocurrent. The photonic IC may be connected to a control circuit, or the feedback control circuit may be integrated into the photonic IC. In either case, the feedback control circuit is configured to change the properties of the laser to be locked until the error signal indicative of the difference between the characteristic wavelength and the wavelength of the laser is zero.

Figure 1:
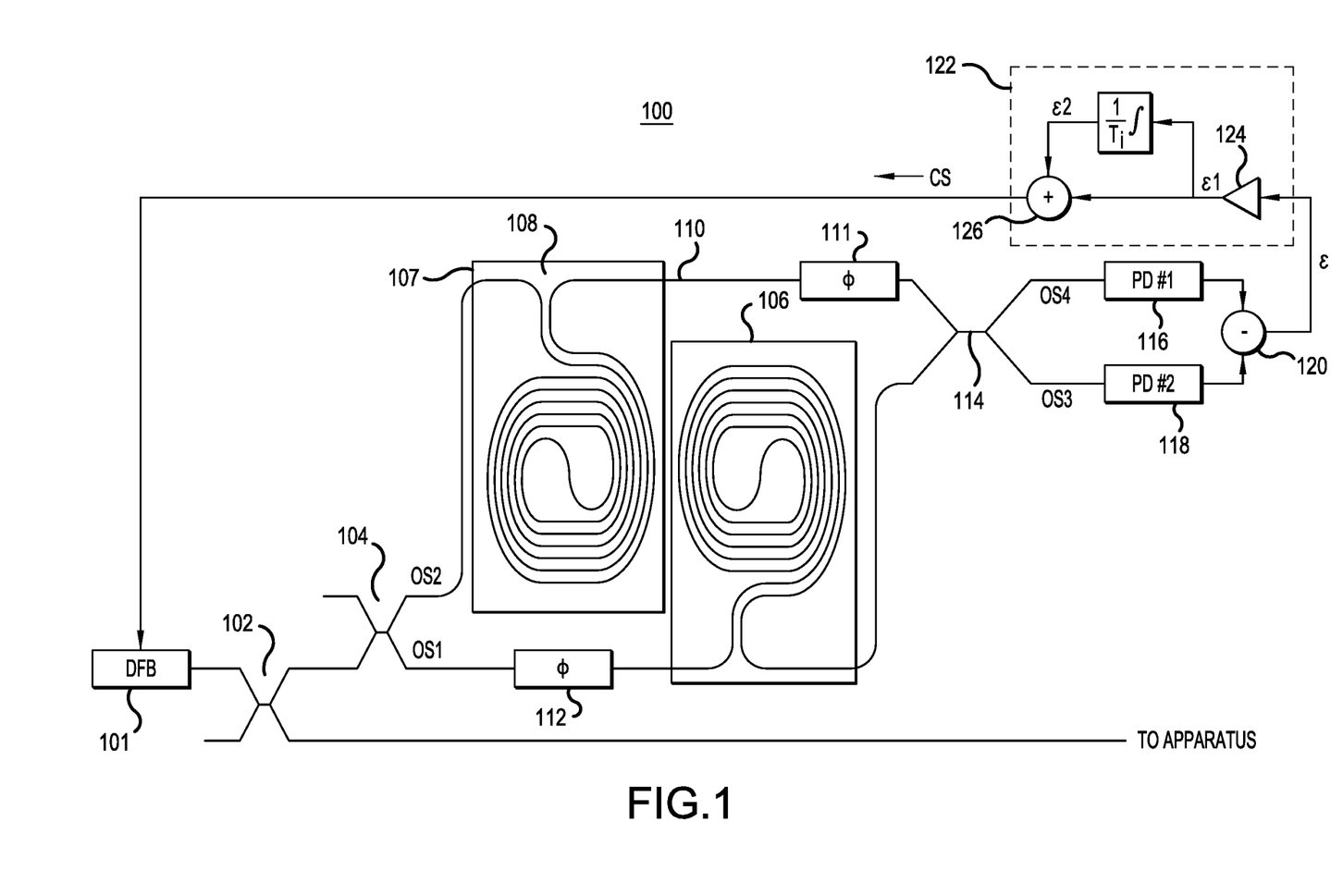
FIG. 1 is a schematic diagram of a laser, and an apparatus for locking a center-wavelength of the laser, in accordance with a representative embodiment.

FIG. 1 is a schematic diagram of a laser 101, and an apparatus 100 for locking a center-wavelength of the laser 101, in accordance with a representative embodiment.

The laser 101 is illustratively a semiconductor laser, such as a distributed feedback (DBF) laser. As alluded to above, the laser 101 is susceptible to drift due to a variety of sources, such as operating and ambient temperature.

The laser 101 may be used for a variety of applications, such as metrology or optical communications, where maintaining the center-wavelength within a comparatively precise wavelength range is useful if not essential to proper operation of an apparatus in which the laser 101 is deployed. Typically, lasers such as He—Ne lasers are specified to have an absolute stability of approximately 0.01 ppm. The present teachings are designed to afford such stability in the laser 101.

The laser 101 provides an output signal that is incident on a first optical splitter 102 that splits a small fraction, which is typically less than ⅒ of the output optical signal from the laser 101 to provide an optical signal to a second optical splitter 104, and another optical signal to the apparatus (e.g., optical wavemeter) in which the laser 101 is deployed, and which is not shown.

The second optical splitter 104 is a 50:50 splitter, and outputs a first optical signal (OS1) to a first arm 106 of an interferometer 110. In an illustrative embodiment, the first optical signal (OS1), which may be referred to as the reference optical signal (OSref), passes a first phase shifter 112 to provide a predetermined phase shift to the reference optical signal OSref relative to the first optical signal OS1.

Similarly, the second optical splitter 104 outputs a second optical signal (OS2) to a second arm 108 of the interferometer 110. The second optical signal (OS2) passes a second phase shifter 111 to provide a predetermined phase shift to the reference optical signal OSref relative to the second optical signal OS2. The phase shifts from first phase shifter 112 and the second phase shifter 111 are used to equalize the optical path length of the first and second arms 106 and 108 due to unavoidable manufacturing tolerances of the two arms.

As will become clearer as the present teachings continue, in order to effect the proper control of the output of the laser 101, the optical path length of the first arm 106 and the second arm 108 need to be substantially identical.

In accordance with a representative embodiment, the interferometer 110 may be a Mach-Zehnder Interferometer (MZI). In one of a number of ways, some or all of the first arm 106 of the interferometer 110 is exposed to a reference gas that has an absorption line at a characteristic wavelength or eigenmode. The reference gas is selected to absorb light having a wavelength that is substantially the same wavelength as the desired output wavelength of the laser 101. Notably, in accordance with the present teachings, at center lock, the output wavelength from laser 101 will be equal to the wavelength of a selected absorption line of the reference gas. As such, a reference gas is chosen a gas that has an absorption line in the region of interest, so as to lock to that line. For the application of the present teachings as a reference laser, any wavelength would work if the wavelength is well known and not significantly changing (e.g., when the temperature or pressure of the absorption gas is changing). As such, the precision of the absorption of the reference gas provides a precision in the lock of laser 101 that is approximately 0.01 ppm or less.

Through the Kramers-Kronig relation any absorption of light is connected with dispersion. In turn, dispersion causes a change in the effective index of refraction ($\Delta n_r$) of the waveguide, and in turn results in a change in the optical path length. A change in optical path length results in a change in the phase of the first optical signal when its wavelength is substantially equal to the characteristic wavelength of the laser 101.

Notably, the absorption by the reference gas and the dispersion are related mathematically. The change of the effective refractive index is proportional to the derivative of the absorption of light by the reference gas. At wavelengths comparatively far from the absorption line the change in the effective index of refraction is essentially zero. Similarly, at the absorption maximum the change in the effective index of refraction is essentially zero. Left and right of the maximum absorption, the slope (and hence the index of refraction, which is proportional to the derivative of the absorption) changes sign. This is the reason why, in accordance with the present teachings, the dispersion beneficially can be used to generate an error signal for driving the laser wavelength to the maximum of absorption. In order to measure the dispersion, the (MZ) interferometer 110 is used. In order to generate a usable error signal, the wavelength of the laser to be locked to the absorption line needs to be within one or two linewidths of the absorption line selected for locking the wavelength of the laser 101. Otherwise, the error signal might become too small to have a substantial effect at the integrator of the control loop (discussed below). This however is not difficult to achieve as the wavelength of the laser 101 can easily be tuned such that it is close enough to the characteristic wavelength of the reference gas.

The manufacturing processes used in the manufacturing of the apparatus 100 can also adversely impact the optical path length of the first and second arms; and can adversely impact the performance of the interferometer 110. As noted above, the optical path length is a product of the geometric length of the waveguide and the group index of refraction. In order to create a balanced Mach-Zehnder interferometer with the first arm 106 and the second arm 108 having substantially the same optical path length, the group index of refractions of the waveguide designs must be known to a high precision if different waveguide designs are used for the "gas sensing" waveguide (of the first arm 106) and the "non-sensing" waveguide (of the second arm 108). It is difficult to manufacture a balanced MZI using different waveguide designs for the first and second arms 106, 108. In addition, typically the "gas sensing" waveguide (of the first arm 106) is created by a partially "oxide-opening" (i.e. removal of the cladding silicon oxide over the arm). The size of this oxide-opening also influences the optical path length of the sensing arm, as it separates the total length into a part with cladding having one group index and another part without cladding having a second different group index. Hence, small size variations due to manufacturing also contribute to imbalances and adversely impact the performance of the interferometer 110. The present teachings overcome these potential imbalances by providing substantially identical first and second arms 106, 108, as discussed immediately below.

Referring again to FIG. 1, and as described more fully in connection with FIG. 3 below, the first arm 106 has a first opening 107 thereabove, and the second arm 108 has a second g 109 thereabove. In order to provide optical path lengths in each of the first and second arms 106, 108, the interferometer 110 of the present teachings is manufactured to ensure first and second openings 107, 109 are provided above the first and second arms 106, 108 and are substantially identical. To this end, "substantially identical" means the first and second arms 106, 108 have the substantially the same geometry. This is realized by forming the components (e.g., the waveguides) of the first and second arms 106, 108 in a single/common etching process, so that manufacturing tolerances that shift the outline or change the dimensions of the waveguide elements of the first and second arms 106, 108, or the depth of the etches, have the same effect on the sensing (first arm 106) and non-sensing (second arm 108) waveguides. Stated somewhat differently, in order to avoid the undesired differences in optical path length, the waveguides of the first and second arms 106, 108 and the first and second openings 107, 109 over both the first arm 106 and the second arm 108 are fabricated during the same manufacturing process. This provides substantially fully symmetric waveguide structures in which the oxide (cladding) layer is removed above both the first and second arms 106, 108. Notably, and as described below in connection with FIG. 3, an inert "filling" gas having substantially the same index of refraction (e.g., n=1) as the reference gas is provided above some or all of the second arm 108. Moreover, and as described more fully below, the covers (not shown) are provided over the first and second openings 107, 109 that substantially hermetically seal the respective gases (reference gas in first opening 107, inert gas in second opening 109) in the volumes of the first and second openings 107, 109, and prevent contamination of these gases. After traversing the respective arms of the interferometer 110, an output optical signal from the first arm 106 and an output optical signal from the second arm 108 are provided to an optical coupler 114, which is a 1×2 or 2×2 optical coupler. The optical coupler 114 combines the output optical signals from the first and second arms of the interferometer 110 to provide a third optical signal (OS3), and optionally, in which case one needs to use a 2×2 coupler, a fourth optical signal (OS4). As such, the third and fourth optical signals are based on the combination of the output optical signals from the first and second arms of the interferometer 110. The optical coupler 114 may be a 3 dB coupler, for example, although it is not limited thereto.

Figure 2A:
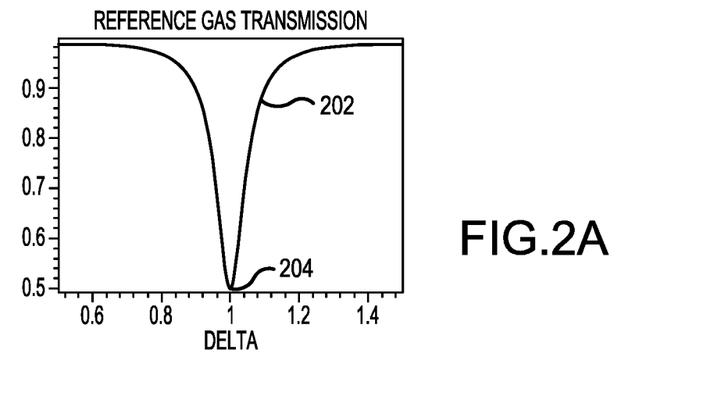
FIG. 2A is a graph showing optical transmission of a reference gas of an apparatus for locking a center-wavelength of a laser in accordance with a representative embodiment.
Figure 2B:
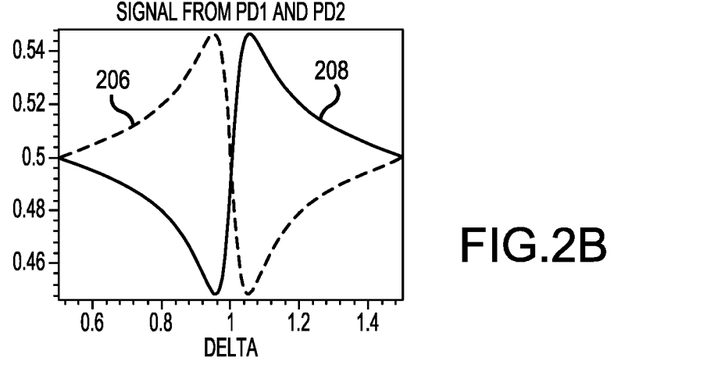
FIG. 2B is a graph showing the output of photodiodes used in an apparatus for locking a center-wavelength of a laser in accordance with a representative embodiment.
Figure 2C:
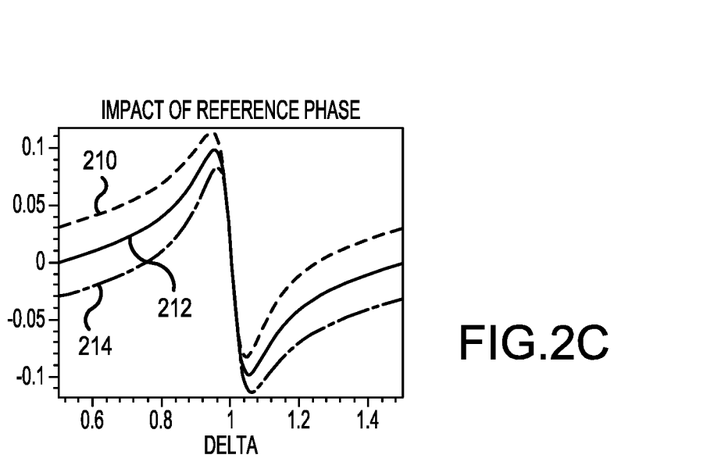
FIG. 2C is a graph showing dependency of an error signal on a value of a phase shifter used in an apparatus for locking a center-wavelength of a laser in accordance with a representative embodiment.

The apparatus 100 further comprises a first photodetector 116 connected to one output of the optical coupler 114, and an optional second photodetector 118 connected to the other output of the optical coupler 114. The first photodetector 116 is configured to detect the third optical signal OS3 from the one output optical coupler 114, and to provide a corresponding first photocurrent PI1. The first photocurrent PI1 indicates a difference between the characteristic wavelength and the wavelength of the output optical signal from the first arm 106 and the output optical signal from the second arm 108. The optional second photodetector 118 is configured to detect the fourth optical signal OS4 from the other output of the optical coupler 114, and to provide a corresponding second photocurrent PI2. The second photocurrent PI2 indicates a difference between the characteristic wavelength and the wavelength of the output optical signal from the first arm 106 and the output optical signal from the second arm 108. The photocurrent PI1 is a sum of a constant value ($PI1_{const}$) and a value that depends on the wavelength ($PI1_\lambda$). On the other hand, PI2 is a sum of a constant value ($PI2_{const}$) and a value that depends on the wavelength $PI2_\square$. If the second optical splitter 104 and the optical coupler 114 are 50:50 couplers, and both photodetectors have the same optical power to current conversion factor, then the two constant values $PI1_{const}$ and $PI2_{const}$ are equal and the wavelength dependent values $PI1_\square$ equals the negative of $PI2_\lambda$. Both the first and second photocurrents PI1 and PI2 are changing if the wavelength of the optical signal in the first arm 106 of the interferometer 110 is changing with respect to the characteristic wavelength. However, the first photocurrent PI1 is increasing in the vicinity of wavelength equal to 1 whereas the second photocurrent PI2 is decreasing, hence the difference (PI1−PI2) increases at about twice the rate and is substantially zero at the characteristic wavelength (assuming the first and second photocurrents are behaving as shown in FIGS. 2A-2C, discussed below).

The first and second photocurrents PI1 and PI2 are input to an adder 120. The adder 120 is configured to determine a difference between the first photocurrent PI1 and the second photocurrent PI2, and to provide an error signal ε=PI1−PI2 indicating the difference. It is beneficial to normalize the error signal using the sum of the two photocurrents, in other words to use an alternative error signal $\varepsilon_n$=(PI1−PI2)/(PI1+PI2). When the characteristic wavelength of the laser 101 is equal to the wavelength of the first optical signal OS1, the error signal ε and alternative error signal $\varepsilon_n$ output by the adder 120 is zero. For example, FIG. 2B depicts the illustrative first and second photocurrents PI1 and PI2 as a function of wavelength.

If only one photodetector is used, the output of the second photodetector is replaced by the product of the total optical power delivered by the laser 101 and a previously recorded and stored factor. The total optical power can either be measured by an independent photodetector (not shown in FIG. 1) or can be inferred from the control parameters of the laser 101. For example, in case of the DFB laser the total optical power can be calculated from the pump current and the conversion factor from current to optical power.

The output of the adder 120 is provided to a feedback control circuit 122 that is configured to provide a control signal CS in response to the error signal ε or $\varepsilon_n$. That is, the feedback control circuit 122 outputs the control signal CS based, at least in part, on each of the first photocurrent PI1 and the second photocurrent PI2, and comparison thereof. The control signal CS controls the bias of the laser 101 enabling the automatic tuning of the laser 101 to the desired output wavelength, which is substantially equal to the characteristic wavelength of the reference gas. Beneficially, by adjusting the bias point with the control signal CS, the laser 101 is controlled to tune its output to be substantially equal to the characteristic wavelength of the reference gas.

In an embodiment, the feedback control circuit 122 is a Proportional Integral (PI) controller configured to receive and process the error signal ε indicating the difference between the wavelength of the output signal of the laser 101 and the characteristic wavelength, and to output the control signal CS in response. The PI controller includes an amplifier 124 that receives and amplifies the error signal ε, outputting amplified error signal ε1. The PI controller further includes an integrating logic device 126 that performs an integration function on the amplified error signal ε1 over time to provide an integrated error signal ε2, and an adder 448 that adds the amplified error signal ε1 and the integrated error signal ε2 to output the control signal CS. In an embodiment, the PI controller may be replaced by a PID controller that also includes differentiating logic, or an integral (I) controller that does not include the proportional part. Of course, the feedback control circuit 122 may include other types of control circuits, such as an on-off controller or controllers using fuzzy logic, without departing from the scope of the present teachings.

While the use of a single photodetector can be used, as will be appreciated, using the difference of photocurrents of PD1 116 and PD2 118 simplifies the determination of the error signal at least because it is not necessary to know the output power of the laser 101, and it is not necessary to store expected difference between ratio of the photocurrent of PD1 116 (or PD2 118) and optical power, and the expected (previously determined and stored value) ratio, since the expected difference at the characteristic wavelength is zero and hence independent of the actual power.

FIG. 2A depicts a graph 202 of transmission of light by the reference gas in accordance with a representative embodiment. Notably, peak absorption at point 204 is indicative of absorption of light at a desired characteristic frequency of the laser 101. Notably, the reference gas is transparent to incident light, except at a few wavelength values (called characteristic/eigen values). These values depend on the type of gas used for the reference gas. To a much lesser extent, the characteristic values also depend on the temperature and pressure of the reference gas, which is why they are used as primary wavelength standards and can be used to stabilize the wavelength of a laser (e.g. laser 101)

As noted above, first phase shifter 112 in the first arm 106 of interferometer 110 shifts the phase of the first optical signal OS1 (i.e., the reference optical signal) relative to the phase of the second optical signal OS2 (i.e., the input optical signal). FIG. 2B depicts an illustrative first photocurrent PI1 206 and second photocurrent PI2 208 when the first optical signal OS1 has been phase shifted the proper amount. The proper amount of phase shifting to be performed by the phase shifter 424 is reached when the error signal versus wavelength is an antisymmetric function with respect to the characteristic wavelength of the absorption line of the reference gas.

As noted above, the adder 120 is configured to determine a difference between the first photocurrent PI1 and the second photocurrent PI2, and to provide an error signal ε indicating the difference. The characteristic wavelength of peak absorption of the reference absorption gas is equal to the wavelength of the input optical signal OS1 when the error signal ε output by the adder 120 is zero. For example, FIG. 2B depicts the illustrative first and second photocurrents PI1 206 and PI2 208 when the error signal ε is equal to zero. In order for the difference of the photocurrents to be zero at the characteristic wavelength, the constant portion of PI1 and the constant portion of PI2 need to be the substantially the same. In accordance with a representative embodiment, this is achieved if the second optical splitter 104 and the optical coupler 114 are each 50:50 couplers and both photodetectors (PD1 and PD2) have the substantially the same sensitivity.

FIG. 2C is a graph showing the error signals resulting from subtraction of the photocurrents from the first and second photodiodes, according to a representative embodiment.

Referring to FIG. 2C, "0" on the vertical axis indicates that both photocurrents are equal which can only occur if the laser wavelength is equal to the characteristic wavelength of the reference gas absorption, and "1" on the horizontal axis indicates that the optical signal OS1 and the absorption line/characteristic wavelength of the absorption gas are equal. The different traces 210, 212, 214 show dependency of the error signal ε on the phase shift provided by the first phase shifter 112 in the first arm 106 of the interferometer 110. For a proper range of phases, the error signal ε changes sign at the characteristic wavelength/absorption line of the absorption gas. The traces 210, 212 and 214 correspond to three different phase shift values. The center trace 212 is the "ideal" phase choice, whereas the other two traces 210 and 214 correspond to a phase change that is slightly above or below the ideal value, respectively. FIG. 2C shows that the actual value of the phase shift does not affect the "working point" of the feedback control circuit 122. In other words, the error signal will be zero if the wavelength of laser 101 and characteristic wavelength of the reference gas are equal regardless of the exact value of the phase shift. As such, for the feedback control circuit 122, the error signal should be zero if the desired condition (i.e., wavelength of laser 101 and characteristic wavelength of the reference gas) is met. The fact that this condition is met even if the phase shift from the first phase shifter 112 is not exactly the ideal value helps to achieve the wanted wavelength lock even with imperfect settings of the first phase shifter 112.

Figure 3:
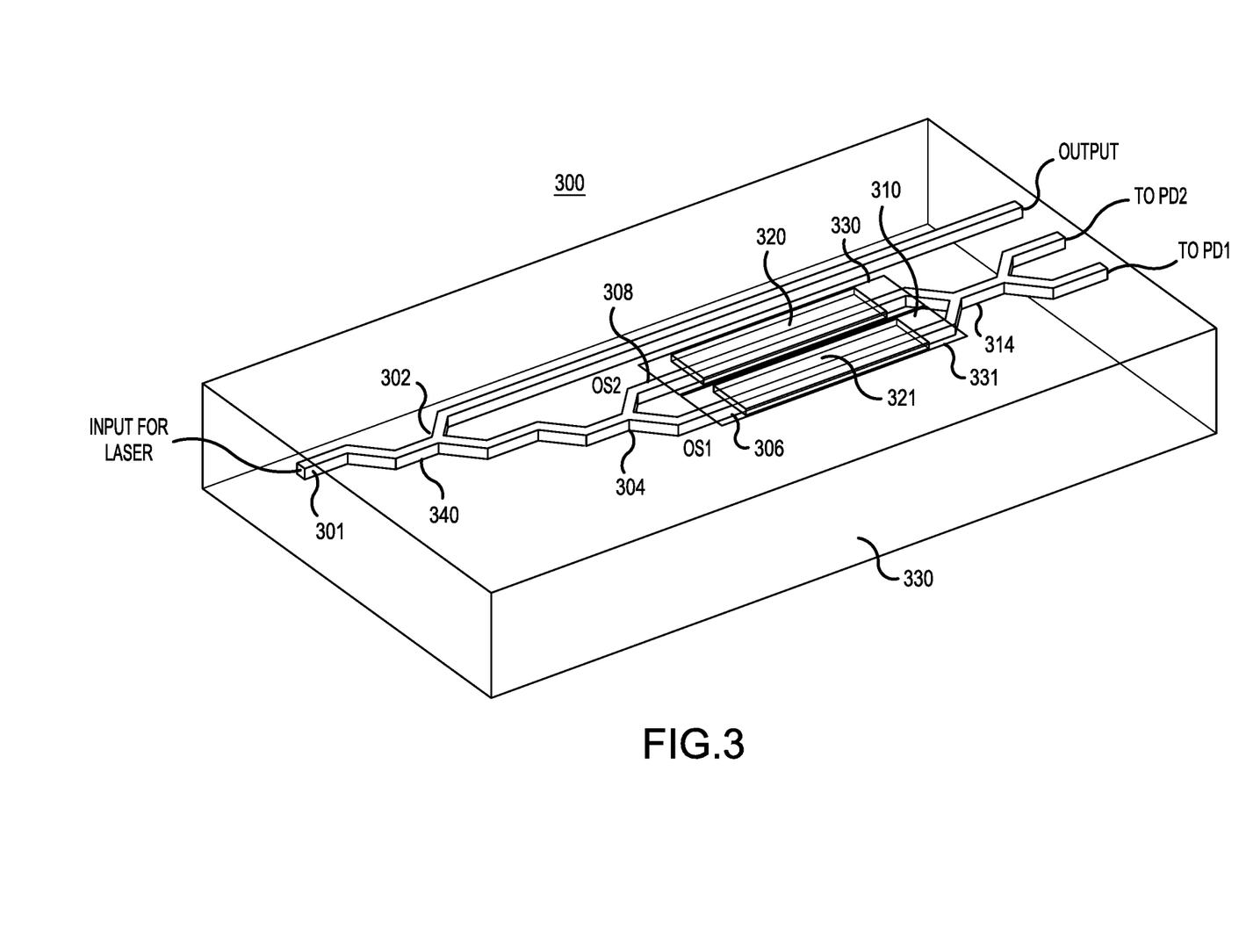
FIG. 3 is a perspective view of a part of a photonic integrated circuit used to lock a wavelength of a laser, in accordance with a representative embodiment.

FIG. 3 is a perspective view of a part of a photonic integrated circuit (IC) 300 used to lock a wavelength of a laser, in accordance with a representative embodiment. Notably, many aspects of the various components of the apparatus 100 described above in connection with FIGS. 1-2C are common to those of photonic IC 300 described presently. These details may not be repeated in the interest of brevity and clarity.

As will be appreciated as the present description continues, photonic IC 300 enables the integration of an absorption cell comprising the absorption gas, the interferometer 110, the second optical splitter 104, the optical coupler 114, the first and second photodetectors 116, 118, as well as other components described above, on a comparatively small photonic integrated chip. Beneficially, the photonic IC 300 provides superior stability compared to bulk optic solutions and can be manufactured at a comparatively low cost. Since the locking scheme does not involve any high-speed electronics, the control electronics can also be built at a comparatively low cost and with very low noise as needed.

Referring to FIG. 3, the photonic IC 300 comprises a series of connected optical waveguides as described herein. In accordance with a representative embodiment, the optical waveguides of the photonic IC 300 are slab waveguides which consist of a channel (core) made of a material having a higher index of refraction disposed in/surrounded by a material (cladding) having a lower index of refraction than the channel. In accordance with a representative embodiment, the waveguides of the photonic IC 300 may comprise a core 340, which is illustratively silicon, disposed in a cladding 330 of silicon dioxide, which may be disposed on a silicon substrate. Generally, photonic IC 300 of various embodiments may be implemented in any material system in which a waveguide and ideally a phase modulator can be built. For example, the core disposed in the cladding for the slab waveguide can be silicon (Si) in silicon dioxide ($SiO_2$), silicon nitride ($Si_3N_4$) in silicon dioxide ($SiO_2$), or doped indium phosphide (InP) in undoped indium phosphide, although other material systems may be incorporated without departing from the scope of the present teachings.

Input from a laser (e.g., laser 101) is provided at a first end of the photonic IC 300. The laser is coupled to an input waveguide 301 by a known optical coupling method. For some material systems (notably InP) the laser may be integrated in the same photonic IC.

The input signal is incident on a first optical splitter 302. Illustratively, typically less than ⅒ of the output optical signal from the laser to provide an optical signal to a second optical splitter 304, and another optical signal to the apparatus (e.g., optical wavemeter) in which the laser is deployed, and which is not shown.

The second optical splitter 304 is a 50:50 splitter, and outputs a first optical signal (OS1) to a first arm 306 of an interferometer 310. In an illustrative embodiment, the first optical signal (OS1), which may be referred to as the reference optical signal (OSref), passes a phase shifter (not shown) that is integrated into the waveguide. This phase shifter can be realized to thermo-optically, stress-optically, or electro-optically change of the effective index of the waveguide, and may for the sake of symmetry, also be integrated into a second arm 308, after the second optical splitter 304 and before the input to the first arm 306 or second arm 308 of the interferometer 310. As noted above, the phase shifter provides a predetermined phase shift to the reference optical signal OSref relative to the first optical signal OS1. This phase shift is used to equalize the optical path length of the first and second arms 306 and 308 due to unavoidable manufacturing tolerances of the two arms, as noted above.

The second optical splitter 304 also outputs a second optical signal (OS2) to a second arm 308 of the interferometer 310.

As described above, the first arm 306 of the interferometer is exposed to a reference gas to cause dispersion, which in turn, causes a change in the effective index of refraction ($\Delta n_r$) of the waveguide, and in turn results in a change in the optical path length. A change in optical path length results in a change in the phase of the first optical signal OS1 when its wavelength is substantially equal to the characteristic wavelength of the laser as noted above. In accordance with a representative embodiment, this exposure to the selected reference gas may be realized through the evanescent tail or through a fraction of the guided optical signal, depending on the type of waveguide used. In the presently described representative embodiment, the cladding layer of the slab waveguide of the first arm 306 of the interferometer 310 is thinned to ensure the evanescent mode of the optical signal has sufficient power to be absorbed in an appreciable amount to alter the dispersion of the first arm 306, and ultimately impact the optical path length of optical signal OS1 traveling in the first arm 306 of the interferometer 310.

In order to ensure enough energy is transmitted through the evanescent mode, a first region 320 of the cladding layer (e.g., $SiO_2$) may be thinned or formed to a thickness in the range of approximately 0 μm (i.e., removed so the core layer is exposed to the reference gas) to approximately while typically the cladding exceeds a thickness of 3 μm when working in the near infrared wavelength range of 1.5 μm. Similarly, and as described below, the cladding layer of the waveguides that make up the second arm 308 of the interferometer 310 is reduced by substantially the same amount as the cladding layer of the waveguides that make up the first arm 306.

More generally, the thickness of the cladding layer (and the portion that is removed or foregone in first region 320) is a design parameter that depends on various factors, which can be selected for a desired absorption level/magnitude. For example, reference gases with comparatively strong absorption (and therefore cause a greater dispersion to be exhibited) at the characteristic value may allow the exposed portion of the first arm to have a comparatively thick cladding. Additionally, the higher the pressure of the reference gas, the thicker the remaining cladding at the exposed portion of the first arm may be since a high pressure provides more molecules per unit length of the waveguide which creates more absorption. However, the desire for a higher pressure of the reference gas is limited since the greater the pressure of the reference gas, the greater the likelihood of undesirable absorption-line broadening. Still another parameter used to improve the absorption is the length of the waveguide in the exposed portion of the first arm. To this end, rather than increasing the pressure of the reference gas, increasing the length of the waveguide in the exposed portion of the first arm, increases absorption according to the Beer-Lambert Law. Of course, the increased length of the waveguide in the first region 320 of the first arm is weighed against the overall size of the photonic IC 300, since this an increase in length of the first region 320 results in an increase in the overall size of apparatus or photonic IC 300. Finally, the gain in the feedback control circuit 122 can also reduce the extent that the cladding is removed from the waveguide in first region 320, with a higher gain allowing for a comparatively thick cladding layer in the exposed portion of the first arm in first region 320.

As alluded to above, in order to provide the second arm 308 having substantially the same optical path length as the first arm 306 (and is substantially symmetric with the first arm 306), a second region 321 of the cladding layer (e.g., $SiO_2$) may be thinned or formed to a thickness in the range of approximately 0 μm (i.e., removed so the core layer is exposed to the inert gas) to approximately while typically the cladding exceeds a thickness of 3 μm when working in the near infrared wavelength range of 1.5 μm. Furthermore, as described above, the waveguides of the first and second arms 306, 308 and the first and second regions 320, 321 are formed in the same fabrication sequence to provide substantially identical waveguides and openings in each of the first and second arms, and the first and second regions. Thereafter, to facilitate providing substantially identical the first and second arms 306, 308, the region above the second arm 308 is filled with an inert gas that has substantially the same index of refraction as the reference gas provided over the first arm 306.

To ensure exposure of the first arm 306 to the only the reference gas, and the exposure of the second arm 308 to only the inert gas respective covers (not shown) of glass, metal or other suitable material are disposed over the first and second regions 320, 321. As such, both volumes of first and second regions 320, 321 have respective covers thereover, and the respective gases (e.g., infrared active reference gas over the first region 320; and infrared inactive "filling" gas over second region two) are encapsulated, and separated from one another to avoid contamination of the respective gases. The covers can be disposed over the first and second regions and sealed using one of a number of known methods. The cover can also be added using a reflow solder process with different melting points so that different gases (and pressures) can be used. Beneficially, the covers and sealing methods used to encapsulate the reference gas in first region 320, and the inert gas in second region 321 substantially hermetically seals the respective gas in respective volumes in first and second regions 320, 321.

After traversing the respective arms of the interferometer 310, an output optical signal from the first arm 306 and an output optical signal from the second arm 308 are provided to an optical coupler 314, which is a 2×2 optical coupler. The optical coupler 314 combines the output optical signals from the first and second arms of the interferometer 310 to provide a third optical signal (OS3), and optionally, a fourth optical signal (OS4). As such, the third and fourth optical signals are based on the combination of the output optical signals from the first and second arms of the interferometer 310. The optical coupler 314 may be a 3 dB coupler, for example, although it is not limited thereto.

As shown, the outputs to the first photodetector (not shown in FIG. 2), and optional, second photodetector (not shown in FIG. 3) are coupled to these photodetectors, which may be fabricated integrally with the photonic IC 300. Similarly, the various components needed to determine error signals and a correction signal (e.g., adder 120, feedback control circuit 122), and the electrical connections required to effect this functionality may be formed during the fabrication process used to manufacture the photonic IC 300.

Finally, the photonic IC 300 is illustratively fabricated using one of a variety of known semiconductor processing methods commonly used in photonics. Just by way of example, in accordance with a representative embodiment in which the core 340 is silicon and the cladding 330 is $SiO_2$, the photonic IC 300 may be formed by forming a first layer of $SiO_2$ on a silicon substrate (not shown). The first layer of $SiO_2$ is comparatively flat and has a thickness of approximately a few micrometers (μm). Next, a thin layer of Silicon is formed over the first layer of $SiO_2$, such as by deposition of silicon. This layer has a thickness of approximately 500 nm. Next, photoresist is added and the etching mask (not shown) is created. Thereafter, the silicon is partially removed using a known etching technique to form the core 340. After formation, the core 340 is covered by a second layer of $SiO_2$ which is flattened to complete the waveguide structure of the photonic IC 300.

The first region 320 and the second region 321 may be formed after the deposition of the second layer of $SiO_2$ by etching the $SiO_2$ to a desired cladding thickness in first region 320 and second region as noted above. Alternatively, during fabrication of the second layer of $SiO_2$, the first region 320 and second region 321 may be masked during formation of the second layer $SiO_2$ for a portion of the deposition to provide a desired cladding thickness in the first region 320 and the second region 321.

Figure 4:
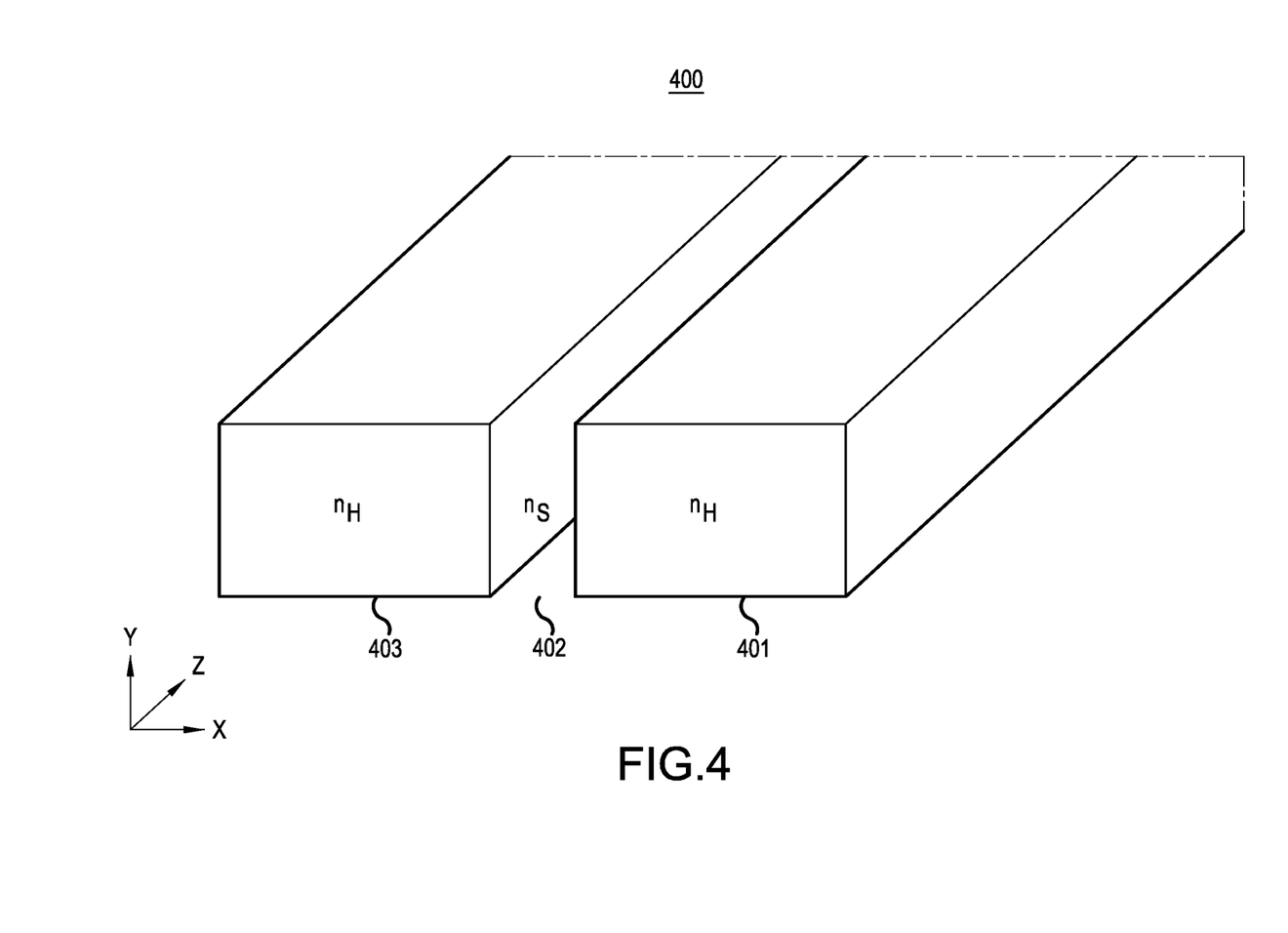
FIG. 4 is a perspective view of a slot optical waveguide for use in a photonic integrated circuit in accordance with a representative embodiment.

As noted above, one type of optical waveguide contemplated by the present teachings is a slab waveguide (e.g., core 340), made from, for example a silicon core layer and silicon dioxide cladding layers. FIG. 4 is a perspective view of a slot optical waveguide 400 contemplated for use in a photonic IC in accordance with a representative embodiment.

The slot optical waveguide 400 is known as a slot waveguide, and comprises a first waveguide portion 401, a second waveguide portion 403 both together forming the actual guiding structure for the single mode waveguide, and a space 402 disposed therebetween. Notably, the first and second waveguide portions 401, 403 have a comparatively high index of refraction relative to the index of refraction of the material in the space. As such, an optical wave will be guided along the z-direction in the coordinate system shown in FIG. 4 with its maximum of the guided mode being in the space 402.

In accordance with a representative embodiment, a slot waveguide such as slot optical waveguide 400 is implemented in the region of a first/reference arm (e.g., first arm 106, 306) of an MZ interferometer (e.g., interferometer 110, 310). The space 402 (and the other portions of the slot optical waveguide 400 surrounding the first and second waveguide portions 401, 403) has a selected reference gas (not shown) disposed therein. This reference gas is used not only for absorption of evanescent modes of the slot optical waveguide 400, but also for the comparatively low index of refraction material needed to support eigenmodes in the slot optical waveguide 400.

Figure 5:
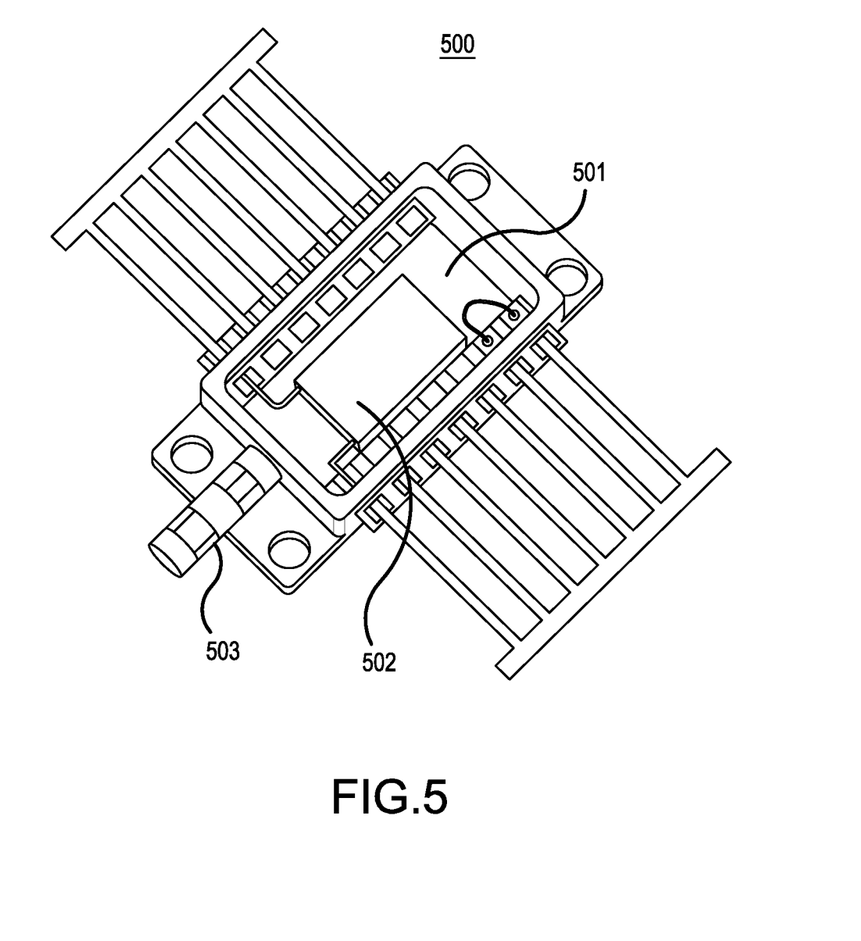
FIG. 5 is a perspective view of a package for housing for an apparatus for locking a center-wavelength of a laser in accordance with a representative embodiment.

FIG. 5 shows a butterfly package 500 contemplated for use in connection with the photonic ICs of the present teachings. Notably, many aspects of the various components of the apparatus 100, the photonic IC 300 and the slot optical waveguide 400 described above in connection with FIGS. 1-4 may be applicable to the butterfly package 500 described presently. These details may not be repeated in the interest of brevity and clarity.

The butterfly package comprises a cavity 501, which when sealed, provides a hermetic enclosure for electronic/optoelectronic components disposed therein. In accordance with a representative embodiment, a photonic IC 502 is disposed in the cavity. The photonic IC 502 may be, for example, the photonic IC 300 described above, with components not shown in FIG. 3 (e.g., first and second photodetectors, adder 120, feedback control circuit 122) may also be integrally formed with the photonic IC 502 disposed in the cavity.

Reference gas (not shown) selected to provide an absorption line at the desired output wavelength of the laser (e.g., laser 101) may be provided in the cavity 501, which is hermetically sealed.

Finally, a laser (e.g., laser 101) that is desirably tuned by the apparatus/photonic chip of the present teachings may also also integrated inside the butterfly package while its output through the photonic IC 300 is connected to optical connector 503 disposed on the outside of the butterfly package 500.

While the invention has been illustrated and described in detail in the drawings and foregoing description, such illustration and description are to be considered illustrative or exemplary and not restrictive; the invention is not limited to the disclosed embodiments.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. An apparatus for locking a wavelength of a laser, the apparatus comprising:
   an optical splitter configured to receive an optical signal and to split an input optical signal to provide a first and second optical signal;
   an interferometer comprising a first arm and a second arm, the first arm being configured to receive the first optical signal and the second arm being configured to receive the second optical signal, wherein a portion of the first arm is exposed to a reference gas that attenuates light of a characteristic wavelength;
   an optical coupler configured to receive an output optical signal from the first arm, and an output optical signal from the second arm and to provide a third optical signal;
   a photodetector configured to receive the third optical signal, and to provide a photocurrent, wherein the photocurrent increases when a difference between the characteristic wavelength, and the wavelength of the output optical signal from the first arm and the output optical signal from the second arm increases; and
   a feedback control circuit configured to change properties of the laser to be locked until an error signal indicative of the difference between the characteristic wavelength and the wavelength of the laser is zero.

2. The apparatus as recited in claim 1, wherein the photodetector is a first photodetector, the photocurrent is a first photocurrent, the optical coupler is configured to provide a fourth optical signal, and the apparatus further comprises a second photodetector configured to receive the fourth optical signal, and to provide a second photocurrent, wherein the second photocurrent decreases when the difference between characteristic wavelength and a wavelength of the optical signal increases.

3. The apparatus as recited in claim 2, further comprising an adder configured to receive the first photocurrent and the second photocurrent, and to provide an error signal indicative of the difference between the wavelength of the first optical signal and the wavelength of the second optical signal.

4. The apparatus as recited in claim 3, wherein the feedback control circuit further comprises a Proportional Integral (PI) controller configured to receive and process the error signal, and in response, to output a control signal to the laser.

5. The apparatus as recited in claim 4, wherein in response to the control signal, the laser emits at the characteristic wavelength.

6. The apparatus as recited in claim 5, wherein the PI controller comprises an amplifier that receives and amplifies the error signal and provides an amplified error signal.

7. The apparatus as recited in claim 6, the PI controller further comprising an integrating logic device that performs an integration function on the amplified error signal over time to provide an integrated error signal.

8. The apparatus as recited in claim 7, wherein the adder is a first adder, and the feedback control circuit further comprises a second an adder configured to add the amplified error signal and the integrated error signal to provide the control signal.

9. The apparatus of claim 1, wherein the properties are one of a bias, temperature, phase shift, or mechanical shift.

10. The apparatus of claim 1, wherein the second arm is exposed to another gas having substantially a same index of refraction as the reference gas.

11. A photonic integrated circuit (IC) for locking a wavelength of a laser, the photonic IC comprising:
   a substrate;
   an optical splitter disposed over the substrate and configured to receive an optical signal and to split an input optical signal to provide a first and second optical signal;
   an interferometer disposed over the substrate and comprising a first arm and a second arm, the first arm being configured to receive the first optical signal and the second arm being configured to receive the second optical signal, wherein a portion of first optical signal from the first arm is exposed to a reference gas that attenuates light of at least one characteristic wavelength;

an optical coupler disposed over the substrate and configured to receive an output optical signal from the first arm, and an output optical signal from the second arm and to provide a third optical signal and a fourth optical signal;

a photodetector disposed over the substrate and configured to receive the third optical signal, and to provide a photocurrent, wherein the photocurrent increases when a difference between the characteristic wavelength, and the wavelength of the output optical signal from the first arm and the output optical signal from the second arm increases; and a feedback control circuit disposed over the substrate and configured to change properties of the laser to be locked until an error signal indicative of the difference between the characteristic wavelength and the wavelength of the laser is zero.

12. The photonic IC as recited in claim 11, wherein the substrate is a semiconductor material, and the optical splitter, the interferometer and the optical coupler each comprise a core of the semiconductor material and cladding of an oxide of the semiconductor material.

13. The photonic IC of claim 12, wherein the photodetector is a first photodetector, the photocurrent is a first photocurrent, and the photonic IC further comprises a second photodetector configured to receive the fourth optical signal, and to provide a second photocurrent, wherein the second photocurrent decreases when the difference between characteristic wavelength, and a wavelength of the output optical signal from the first arm and the output optical signal from the second arm increases.

14. The photonic IC as recited in claim 13, further comprising an adder configured to receive the first photocurrent and the second photocurrent, and to provide an error signal indicative of the difference between the wavelength of the first optical signal and the wavelength of the second optical signal.

15. The photonic IC as recited in claim 14, wherein the feedback control circuit further comprises a Proportional Integral (PI) controller configured to receive and process the error signal, and in response, to output a control signal to the laser.

16. The photonic IC as recited in claim 15, wherein, in response to the control signal, the laser emits at the wavelength.

17. The photonic IC as recited in claim 11, wherein the first arm comprises a slab optical waveguide, and the portion of the first optical signal is an evanescent wave.

18. The photonic IC as recited in claim 11, wherein the first arm comprises a slot optical waveguide, and the portion of the first optical signal is a maximum of a Gaussian of the slot optical waveguide.

19. The photonic IC of claim 11, wherein the properties are one of a bias, temperature, phase shift, or mechanical shift.

20. The photonic IC of claim 11, wherein, and the second arm is exposed to another gas having substantially a same index of refraction as the reference gas.

* * * * *